United States Patent [19]
Krivokapic et al.

[11] Patent Number: 5,601,954
[45] Date of Patent: Feb. 11, 1997

[54] ATTENUATED PHASE SHIFT MASK COMPRISING PHASE SHIFTING LAYER WITH PARABOLICALLY SHAPED SIDEWALLS

[75] Inventors: Zoran Krivokapic, Santa Clara; Christopher A. Spence, Sunnyvale, both of Calif.

[73] Assignee: Advanced Micro Devices Incorporated, Sunnyvale, Calif.

[21] Appl. No.: 469,148

[22] Filed: Jun. 5, 1995

Related U.S. Application Data

[62] Division of Ser. No. 250,898, May 31, 1994.

[51] Int. Cl.⁶ .................................................. G03F 9/00
[52] U.S. Cl. .............................. 430/5; 430/313; 430/322; 430/324
[58] Field of Search .............................. 430/5, 313, 322, 430/324

[56] References Cited

U.S. PATENT DOCUMENTS 5,286,581  8/1991  Lee .............................................. 430/5

FOREIGN PATENT DOCUMENTS

| | | | |
|---|---|---|---|
| 0401795 | 6/1990 | European Pat. Off. | G03F 1/14 |
| 0475694 | 9/1991 | European Pat. Off. | G03F 1/14 |
| 0565473 | 3/1993 | European Pat. Off. | G03F 1/14 |
| 4238441 | 11/1992 | Germany | G03F 1/08 |
| 03144452 | 6/1991 | Japan | G03F 1/08 |
| 06180497 | 6/1994 | Japan | G03F 1/08 |
| 6242592 | 9/1994 | Japan | G03F 1/08 |

OTHER PUBLICATIONS

M. D. Levenson et al, "Improving Resolution in Photolithography with a Phase–Shifting Mask", IEEE Transactions on Electron Devices, vol. ED–29, No. 12, pp. 1828–1836 (Dec. 1982).

R. A. Ferguson et al, "Impact of Attenuated Mask Topography on Lithographic Performance", SPIE Meeting, Mar. 1994, paper No. 2197–12.

M. Nakajima et al, "Attenuated phase–shifting mask with a single–layer absorptive shifter of CrO, CrON, MoSiO and MoSiON flim", SPIE Meeting, Mar. 1994, paper No. 2197–10.

A. Wong et al, "Phase–Shifter Edge Effects on Attenuated Phase–Shifting Mask Image Quality", SPIE Meeting, Mar. 1994, paper No. 2197–11.

*Primary Examiner*—S. Rosasco
*Attorney, Agent, or Firm*—Benman Collins & Sawyer

[57] ABSTRACT

An attenuated phase shift mask comprises a first layer having a thickness to provide a transmission in the range of about 3 to 10% formed on a transparent substrate and a second layer comprising a transparent material having a thickness to provide a desired phase shift, formed on said first layer. For a phase shift of 180° and i-line wavelength (365 nm), where chromium is used as the first layer, then a thickness within the range of about 25 to 75 run is employed; where silicon dioxide is used as the second layer, then a thickness of about 400 to 450 nm is employed. While the oxide may be dry-etched, an isotropic wet etch provides superior aerial images.

8 Claims, 3 Drawing Sheets

5,601,954

ATTENUATED PHASE SHIFT MASK COMPRISING PHASE SHIFTING LAYER WITH PARABOLICALLY SHAPED SIDEWALLS

This is a division of application Ser. No. 08/250,898 filed May 31, 1994, now abandoned.

TECHNICAL FIELD

The present invention relates generally to lithographic techniques employed in the manufacture of integrated circuits (ICs), and, more particularly, to the fabrication of the reticle mask used in photolithography to process semiconductor wafers.

BACKGROUND ART

Phase shift mask technology approaches have been discussed thoroughly in the literature; the original work was begun by M. D. Levenson et al, "Improving Resolution in Photolithography with a Phase-Shifting Mask", *IEEE Transactions on Electron Devices*, Vol. ED-29, No. 12, pp. 1828–1836 (December 1982).

Attenuated phase-shift masks (APSMs) have been disclosed that employ a thin layer which is partially light transmissive and is involved in the phase shift. One such approach uses a thin layer of chromium (a few hundred angstroms, Å), while a second such approach uses a chromium oxide. In the first approach, 30 nm of Cr and dry-etching into quartz 0.42 μm deep is used to achieve 180° phase shift. In the second approach, a thicker layer of a chromium oxide, on the order of 200 nm, and an isotropic etch into the quartz substrate, 0.04 μm deep, is used to achiever 180° phase shift. The foregoing values are based on using i-line wavelength (365 nm).

Simulation results using a vector simulator called TEMPEST (time-domain electromagnetic massively parallel evaluation of scattering on topography) show that the first approach gives better results, compared to the second approach. Exposure-defocus graphs, for example, show that for chromium oxide masks, focus budget is significantly less than for thin chrome ones. Attenuated phase-shift masks print smaller critical dimensions (CDs). The correlation between simulation and experimentation has been established; see, e.g., R. A. Ferguson et al, "Impact of Attenuated Mask Topography on Lithographic Performance", SPIE Meeting, March 1994, paper no. 2197–12.

The drawback with both of the foregoing approaches is that both require etching into the silicon dioxide (quartz) substrate to obtain the correct phase shift of 180°. Such etching is difficult to control within very tight specification tolerances. Thus, what is needed is a process that provides the correct phase shift of 180° without etching into the silicon dioxide substrate.

DISCLOSURE OF INVENTION

In accordance with the invention, an attenuated phase shift mask comprises a first layer formed on a transparent substrate and a second layer comprising a transparent material formed on the first layer. The first layer has a thickness calculated to provide a transmission in the range of about 3 to 10%, while the second layer has a thickness calculated to provide the desired 180° phase shift at the wavelength used.

A process for fabricating the attenuated phase shift mask of the invention comprises:

(a) providing the transparent substrate;
(b) forming the first layer on a surface of the transparent substrate;
(c) forming the second layer on the first layer;
(d) forming a masking layer on the second layer;
(e) patterning and etching the masking layer to expose portions of the second layer;
(f) etching through the exposed portions of the second layer to form first openings and to expose portions of the first layer;
(g) removing the masking layer; and
(h) etching through the exposed portions of the first layer to form second openings.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

Figure 1:
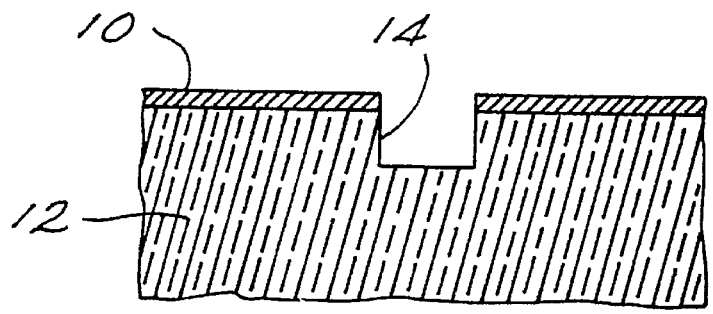
FIG. 1 is a cross-sectional view, depicting a portion of a phase shift mask, employing one prior art approach.

FIG. 1 depicts one prior art approach, in which a thin chromium film 10 is formed on a quartz substrate 12. The thickness of the chromium film 10 is on the order of 30 nm, in order to provide a transmittance of about 9% at i-line wavelength (365 nm). An opening 14 is formed in the chromium film 10, and the substrate 12 is etched to a depth calculated to provide the desired 180° phase shift. That depth is 0.42 μm and is obtained by dry-etching of the quartz substrate 12. It will be appreciated by those skilled in this art that only one opening 14 is shown; however, over the entire area of the quartz substrate 12, there are a plurality of such openings, having the requisite pattern for photolithographic processing of semiconductor wafers.

Figure 2:
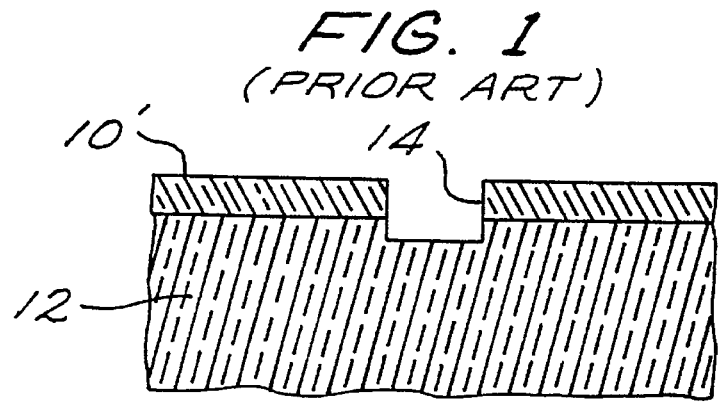
FIG. 2 is a cross-sectional view, depicting a portion of a phase shift mask, employing another prior art approach.

FIG. 2 depicts another prior art approach, in which a chromium oxide film 10' is formed, again on a quartz substrate 12. The thickness of the chromium oxide film 10' is thicker than the chromium film 10, and is on the order of 200 nm, in order to provide a transmittance of 9%, again at i-line wavelength. An opening 14 is formed in the chromium oxide film 10', and the substrate 12 is etched to a depth calculated to provide the desired 180° phase shift. That depth is 0.04 μm and is obtained by wet isotropic etching of the quartz substrate 12.

Figure 3:
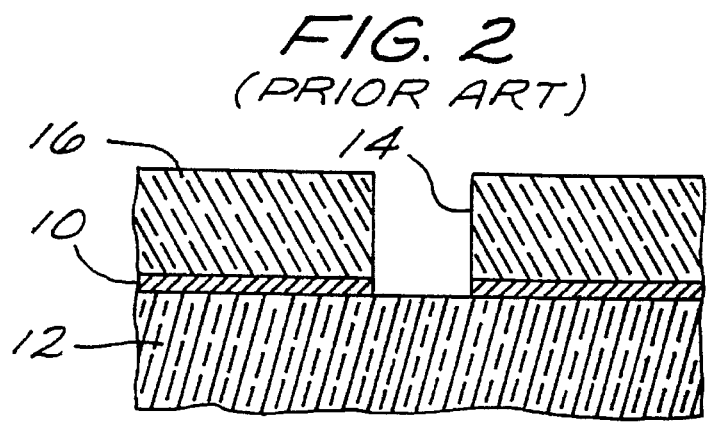
FIG. 3 is a cross-sectional view, depicting a portion of a phase shift mask, in accordance with the present invention.
Figure 4:
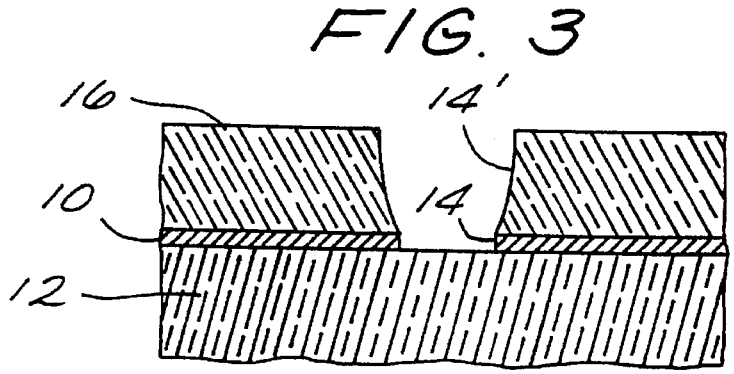
FIG. 4 is a view similar to that-of FIG. 3, depicting an alternate embodiment of the present invention.

In accordance with the present invention, etching of the quartz substrate 12 is avoided by forming a transparent layer 16 on the thin metal film 10; the resulting structure is depicted in FIGS. 3 and 4. The layer 16 comprises a transparent material, and is also referred to herein as the "phase shift" layer.

The thickness of the thin metal film 10 depends on the transmittance required, the composition of the thin film, and the wavelength employed. For a desired transmittance of about 3% to 10%, chromium as the metal, and i-line wavelength (365 nm), the thickness is within the range of about 25 to 75 nm, with thicker films providing lower transmittances. It should be noted that the transmittance also depends somewhat on the purity of the chromium film 10, which may include minor amounts of oxygen and nitrogen.

The composition of the thin metal film 10 may comprise any of the well-known metals and metal oxides, carbides, and nitrides used in semiconductor fabrication. The material comprising these films 10 must be light absorbing and able to transmit about 3 to 10% of incident light (optical, UV, X-ray) in a convenient thickness.

Examples of suitable metals and metal oxides include chromium, molybdenum, and polysilicon (for visible light lithography), and silicon nitride, titanium oxide, and selenium oxide (for deep UV lithography). Preferably, chromium is employed as the thin metal film 10, at a thickness in the range of about 25 to 75 nm (for i-line wavelength; the use of other wavelengths will require use of a different thickness). The determination of such different thickness is not considered to constitute undue experimentation for the person skilled in this art.

The thickness of the phase shift layer 16 depends on the phase shift required, the composition of the phase shift layer, and., as with the thin film 10, the wavelength. For a phase shift of 180°, silicon dioxide as the phase shift layer, and i-line wavelength (365 nm), the thickness of the phase shift layer 16 is within the range of about 400 to 450 nm. As stated above with respect to the thickness of the chromium layer 10, use of other wavelengths will require use of a different thickness.

The composition of the phase shift layer be may comprise any of the transparent materials that are commonly used in semiconductor processing, such as oxides and polymers. The phase shift layer 16 may be deposited by any of the processes commonly employed in semiconductor processing, such as sputtering, chemical vapor deposition, and spin-on. The important properties of this layer 16 is that it is easy to deposit on the film-coated substrate, that its thickness is well-controlled, and that in a given thickness range, it can shift the phase of the incident light by a pre-selected amount, here, 180°.

Examples of suitable oxides include silicon oxide, which permits close matching of optical quality with the quartz substrate 12; examples of suitable polymers include polyimide. However, this list should not be considered as limiting.

In the most preferred embodiment, the first layer 16 comprises chromium and the wavelength is i-line (365 nm), the thickness of the first layer is within the range of about 25 to 75 nm. A phase shift of 180° is obtained with, for example, a silicon dioxide layer having a thickness in the range of about 400 to 450 nm. While the oxide may be dry-etched, an isotropic wet etch provides superior aerial images.

Figure 5:
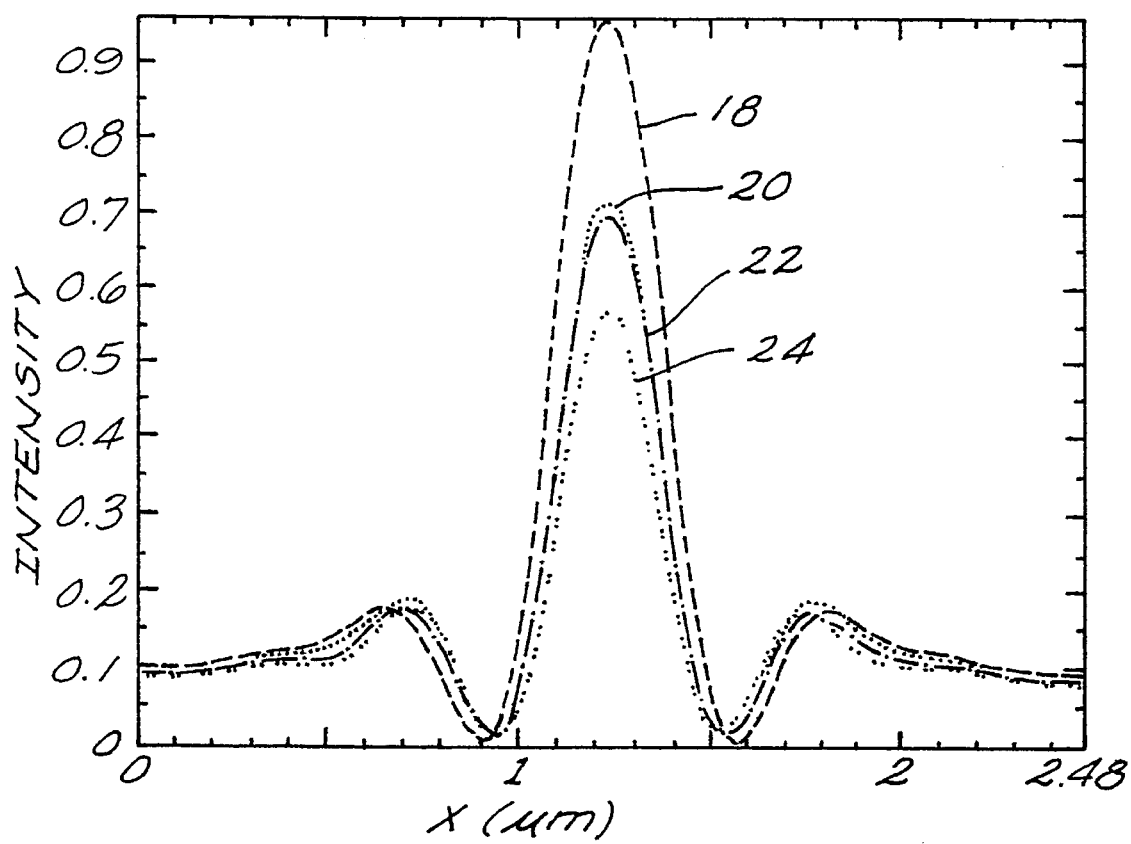
FIG. 5, on coordinates of intensity and distance, is a plot of the intensity as a function of distance in an opening of the phase shift mask, comparing the results obtained from prior art approaches with the results obtained from the present invention, all at a transmittance of 9% and a phase shift of 180°.

Dry-etching of the oxide layer 16, followed by etching of the thin chromium film 10, may be performed to form the opening 14, shown in FIG. 3. Alternatively, isotropic wet etching of the oxide layer 16 may be performed to form opening 14' in the oxide layer, followed by etching of the thin chromium film 10 to form opening 14 in the thin chromium film, as shown in FIG. 4. This latter isotropic wet etching of the oxide 16 is preferred, since the contour of the oxide defining the opening 14', which is typically parabolic (or substantially parabolic), as a result of the wet isotropic etching, serves to more efficiently focus light through the opening 14 in the thin chromium layer The mask of the present invention provides an improved peak:side-lobe intensity ratio compared to a conventional mask, as seen in FIG. 5, which is a comparison of aerial images. It will be seen that the wet-etched $SiO_2$/Cr mask of the present invention is superior to the prior art chromium and chromium oxide masks. Curve 18 represents the wet-etched $SiO_2$/Cr mask of the present invention, in which the chromium film 10 is 25 nm thick and the $SiO_2$ layer is 415 nm thick. Curve 20 represents the dry-etched $SiO_2$/Cr mask of the present invention, having the same chromium and silica thicknesses as the wet-etched mask. Curve 22 represents the prior art mask using 30 nm of chromium, while Curve 24 represents the prior art mask using 200 nm of chromium oxide. The measurements are for an 0.4 μm opening in focus. The ratio of peak intensity to intensity of side-lobes is 50% better for Curve 20 than for the next best case.

The wet-etched $SiO_2$/Cr mask of the present invention remains superior even under defocusing to f=+1.0 μm or f=−1.0 μm.

Figure 6A:
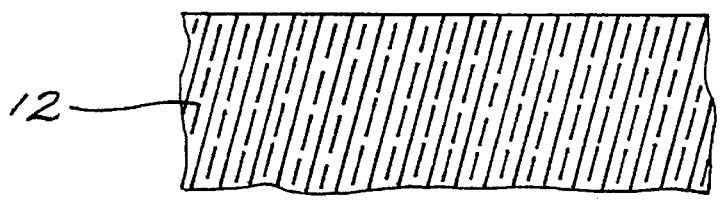
FIGS. 6a–e are cross-sectional views, depicting the process flow in the fabrication of the phase shift mask of the present invention, employing the alternate, preferred embodiment.

FIGS. 6a–e depict the process sequence for forming the mask of the present invention. The quartz substrate 12 is provided, as shown in FIG. 6a. While the substrate 12 may comprise quartz, it will be readily apparent to those skilled in this art that any transparent material may be used in place of quartz, such as silica-based glass.

Figure 6B:
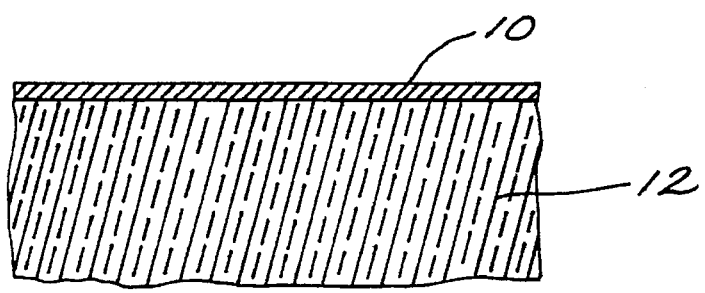

The thin metal film 10, such as chromium, is deposited on the surface of the substrate 12, shown in FIG. 6b.

Figure 6C:
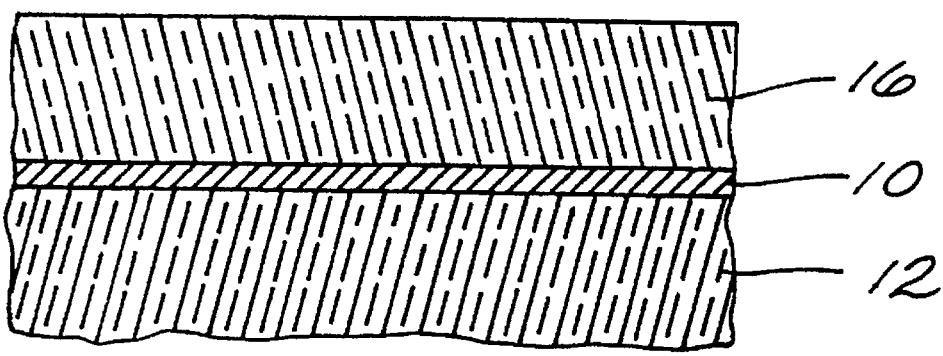

Next, the phase shift layer 16, such as silicon dioxide, is deposited on the surface of the thin chromium film 10, such as by sputtering, as shown in FIG. 6c. A photoresist layer 26 is formed on top of the oxide layer 16 and is patterned and etched, to expose portions of the underlying oxide layer. The photoresist layer may comprise any of the common photoresist materials. In this instance, a positive photoresist was used.

Figure 6D:
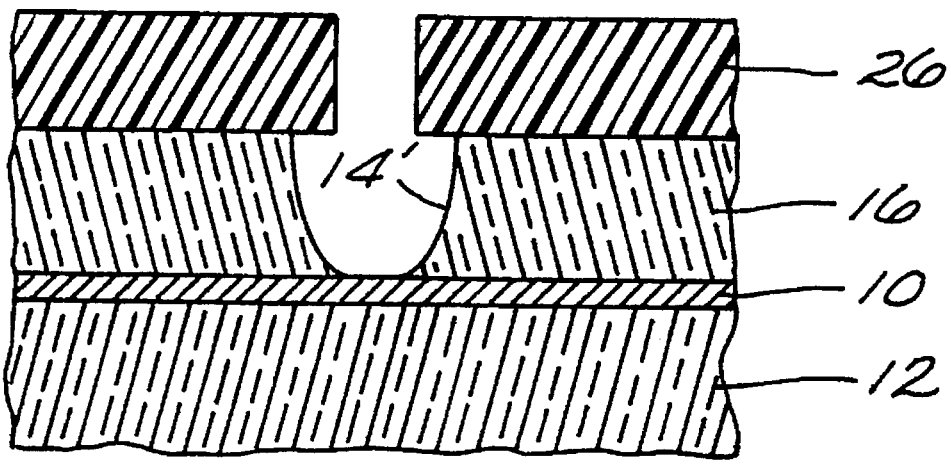
Figure 6E:
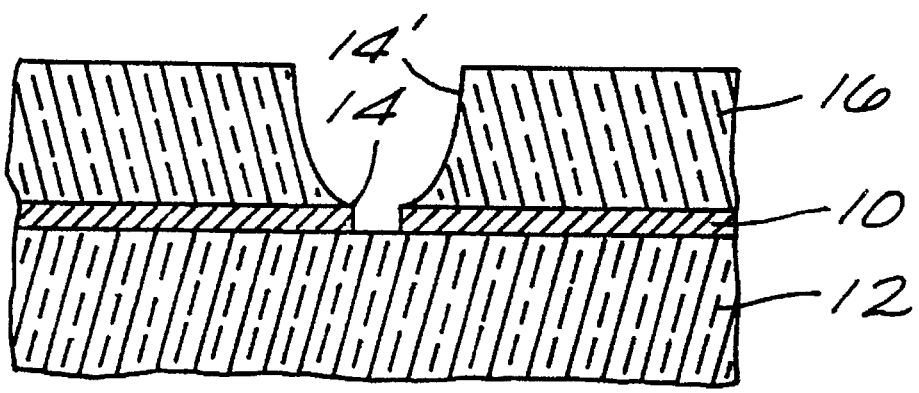

The exposed portions of the oxide layer is next etched, either by a dry process or, as shown in FIG. 6d, by an isotropic wet process, to form opening 14'. This etching of the oxide layer 16 exposes portions of the underlying thin chromium film 10, which are removed by etching, to form opening 14, as shown in FIG. 6e. Advantageously, the photoresist layer 26 is stripped off prior to etching of the chromium portions.

The attenuated phase shift mask of the present invention and the process for fabricating it provide several benefits. First, the mask is easy to make. Second, its ease of fabrication permits use of such attenuated phase shift masks for all of the mask sets used in processing a semiconductor chip. That is to say, the chip manufacturer is not limited to using phase shift masks simply for critical procedures or dimensions.

INDUSTRIAL APPLICABILITY

The attenuated phase shift mask of the present invention is expected to find use in semiconductor processing employing photolithographic procedures.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for fabricating an attenuated phase shift mask comprising a first layer having a transmission in the range of about 3 to 10% formed on a transparent substrate and a second layer comprising a transparent material having a thickness to provide a desired phase shift and formed on said first layer, said process comprising:

(a) providing said transparent substrate;

(b) forming said first layer on a surface of said transparent substrate;

(c) forming said second layer on said first layer;

(d) forming a masking layer on said second layer;

(e) patterning and etching said masking layer to expose portions of said second layer;

(f) etching through said exposed portions of said second layer with an isotropic wet etching process, thereby forming first openings which are defined by substantially parabolically-profiled walls and exposing portions of said first layer;

(g) removing said masking layer; and (h) etching through said exposed portions of said first layer to form second openings.

2. The process of claim 1 wherein said first layer comprises a material selected from the group consisting of metals and metal oxides.

3. The process of claim 1 wherein said first layer comprises a material selected from the group consisting of chromium, molybdenum, polysilicon, silicon nitride, titanium oxide, and selenium oxide.

4. The process of claim 3 wherein said first layer consists essentially of chromium and is deposited to a thickness within the range of about 25 to 75 nm for an incident wavelength of 365 nm.

5. The process of claim 1 wherein said desired phase shift mask is 180°.

6. The process of claim 5 wherein said second layer comprises a material selected from the group consisting of oxides and polymers.

7. The process of claim 6 wherein said second layer consists essentially of silicon dioxide and has a thickness within the range of about 400 to 450 nm for an incident wavelength of 365 nm.

8. A process for fabricating an attenuated phase shift mask providing a phase shift of 180°, said attenuated phase shift mask comprising (a) a first layer formed on a transparent substrate, said first layer consisting essentially of chromium, having a transmission within the range of about 3 to 10%, and having a thickness within the range of about to 75 nm for incident light of 365 nm, and (b) a second layer formed on said chromium layer, said second layer consisting essentially of silicon dioxide and having a thickness within the range of about 400 to 450 nm for incident light of 365 nm, said process comprising:

(a) providing said transparent substrate;

(b) forming said chromium layer on a surface of said transparent substrate;

(c) forming said silicon dioxide layer on said chromium layer;

(d) forming a photoresist masking layer on said silicon dioxide layer;

(e) patterning and etching said photoresist masking layer to expose portions of said silicon dioxide layer;

(f) etching through said exposed portions of said silicon dioxide layer using an isotropic wet etching process, thereby forming first openings which are defined by substantially parabolically-profiled walls and exposing portions of said chromium layer;

(g) removing said photoresist masking layer; and (h) etching through said exposed portions of said chromium layer to form second openings.

\* \* \* \* \*